(12) United States Patent
Shi et al.

(10) Patent No.: US 11,567,403 B2
(45) Date of Patent: Jan. 31, 2023

(54) QUANTUM DOT COLOR FILTER, FABRICATION METHOD THEREOF, DISPLAY PANEL AND DEVICE

(71) Applicant: BOE Technology Group Co., Ltd., Beijing (CN)

(72) Inventors: Ge Shi, Beijing (CN); Ming Zhu, Beijing (CN); Zheng Fang, Beijing (CN); Yanliu Sun, Beijing (CN); Haijun Niu, Beijing (CN); Shiyu Zhang, Beijing (CN); Song Yang, Beijing (CN); Yujie Liu, Beijing (CN); Yuyao Wang, Beijing (CN); Jiahui Han, Beijing (CN); Xiaochuan Chen, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 293 days.

(21) Appl. No.: 16/861,956

(22) Filed: Apr. 29, 2020

(65) Prior Publication Data
US 2021/0124262 A1    Apr. 29, 2021

(30) Foreign Application Priority Data
Oct. 29, 2019 (CN) .......................... 201911036741.4

(51) Int. Cl.
*G02F 1/1335*    (2006.01)
*G03F 7/00*    (2006.01)
(Continued)

(52) U.S. Cl.
CPC ...... *G03F 7/0007* (2013.01); *G02F 1/133512* (2013.01); *G02F 1/133617* (2013.01);
(Continued)

(58) Field of Classification Search
CPC ........... G02F 1/133614; G02F 1/01791; G02F 1/133617; G02F 2201/44; H01L 51/502;
(Continued)

(56) References Cited

U.S. PATENT DOCUMENTS

| | | | |
|---|---|---|---|
| 2009/0103019 A1* | 4/2009 | Wu | G02F 1/133516 349/106 |
| 2010/0087352 A1* | 4/2010 | Mason | C11D 11/00 430/326 |

(Continued)

FOREIGN PATENT DOCUMENTS

| | | |
|---|---|---|
| CN | 102103224 A | 6/2011 |
| CN | 103777447 A | 5/2014 |

(Continued)

OTHER PUBLICATIONS

Office Action dated Sep. 16, 2021 issued in corresponding Chinese Application No. 201911036741.4.

*Primary Examiner* — Mariam Qureshi
(74) *Attorney, Agent, or Firm* — Nath, Goldberg & Meyer; Joshua B. Goldberg (57) ABSTRACT

The present disclosure provides a quantum dot color filter, a fabrication method thereof, a display panel and a display device, and belongs to the field of display technology. The quantum dot color filter of the present disclosure includes a quantum dot functional layer configured to emit light of a certain color under excitation of excitation light. The quantum dot functional layer has a hollowed-out portion, which exposes a side surface of the quantum dot functional layer, so that the excitation light is able to arrive at the side surface.

4 Claims, 7 Drawing Sheets

(51) Int. Cl.
*G02F 1/13357* (2006.01)
*H01L 27/32* (2006.01)

(52) U.S. Cl.
CPC .......... *H01L 27/322* (2013.01); *H01L 27/323* (2013.01); *H01L 27/3244* (2013.01)

(58) Field of Classification Search
CPC ........ H01L 31/035218; H01L 51/5012; H05B 33/00
See application file for complete search history.

(56) References Cited

U.S. PATENT DOCUMENTS

| | | | |
|---|---|---|---|
| 2017/0090247 A1* | 3/2017 | Lee ........................ | G02F 1/1368 |
| 2018/0156951 A1* | 6/2018 | Baek ...................... | H01L 27/322 |
| 2019/0146270 A1* | 5/2019 | Kim .................. | G02F 1/133617 |
| | | | 349/61 |
| 2019/0390076 A1* | 12/2019 | Isonaka .................. | C09D 11/40 |
| 2020/0347291 A1* | 11/2020 | Fang ..................... | C08F 220/54 |

FOREIGN PATENT DOCUMENTS

| | | | |
|---|---|---|---|
| CN | 105874385 A | 8/2016 |
| CN | 108107627 A | 6/2018 |
| CN | 108205220 A | 6/2018 |
| CN | 108919558 A | 11/2018 |
| CN | 109031767 A | 12/2018 |
| CN | 109765728 A | 5/2019 |
| CN | 110112172 A | 8/2019 |

\* cited by examiner

QUANTUM DOT COLOR FILTER, FABRICATION METHOD THEREOF, DISPLAY PANEL AND DEVICE

CROSS-REFERENCE TO RELATED APPLICATION

This application claims the benefit of priority to Chinese Patent Application No. 201911036741.4 filed on Oct. 29, 2019, the contents of which are incorporated herein in their entirety by reference.

TECHNICAL FIELD

The present disclosure belongs to the field of display technology, and particularly relates to a quantum dot color filter, a fabrication method thereof, a display panel and a display device.

BACKGROUND

At present, quantum dot technology is increasingly applied in the field of display technology. Among others, the quantum dot color filter (QDCF) is most widely applied. The quantum dot color filter replaces the conventional color filter and is applied to various types of display devices, such as liquid crystal display (LCD) devices or organic light-emitting diode (OLED) display devices.

SUMMARY

The present disclosure provides a quantum dot color filter including a quantum dot functional layer, and the quantum dot functional layer is configured to emit light of a certain color under excitation of excitation light. The quantum dot functional layer has a hollowed-out portion, which exposes a side surface of the quantum dot functional layer, so that the excitation light is able to arrive at the side surface.

In some embodiments, the quantum dot functional layer includes a plurality of strip structures extending in a same direction, a gap is between adjacent strip structures, and gaps between the plurality of strip structures define the hollowed-out portion.

In some embodiments, a gap between any two adjacent strip structures has a same width.

In some embodiments, the quantum dot functional layer includes a plurality of block structures arranged in an array, and a gap is between adjacent block structures; gaps between the plurality of the block structures define the hollowed-out portion.

In some embodiments, the block structure includes any one of a rectangular block structure, a circular block structure, and a diamond block structure.

In some embodiments, the quantum dot color filter has a plurality of filter regions arranged at intervals, and each filter region includes a plurality of sub-filter regions arranged at intervals; at least part of the plurality of sub-filter regions are provided with the quantum dot functional layer; and colors of light from the plurality of sub-filter regions included in each filter region are different from each other.

In some embodiments, the excitation light is blue light, and the plurality of sub-filter regions include a red sub-filter region, a green sub-filter region, and a blue sub-filter region; the quantum dot functional layer includes a red light quantum dot functional layer and a green light quantum dot functional layer, the red light quantum dot functional layer is configured to emit red light under excitation of blue light, and the green light quantum dot functional layer is configured to emit green light under excitation of blue light. The red light quantum dot functional layer is in the red sub-filter region; the green light quantum dot functional layer is in the green sub-filter region; and a transparent insulating layer capable of transmitting blue light is in the blue sub-filter region.

In some embodiments, the excitation light is blue light, and the plurality of sub-filter regions include a red sub-filter region, a green sub-filter region, and a blue sub-filter region; the quantum dot functional layer includes a red light quantum dot functional layer, a green light quantum dot functional layer and a blue light quantum dot functional layer, the red light quantum dot functional layer is configured to emit red light under excitation of blue light, the green light quantum dot functional layer is configured to emit green light under excitation of blue light, and the blue light quantum dot functional layer is configured to emit blue light under excitation of blue light. The red light quantum dot functional layer is in the red sub-filter region; the green light quantum dot functional layer is in the green sub-filter region; and the blue light quantum dot functional layer is in the blue sub-filter region.

In some embodiments, a light shielding layer is between adjacent sub-filter regions.

In some embodiments, a thickness of the light shielding layer is greater than or equal to a thickness of the quantum dot functional layer.

In some embodiments, the thickness of the light shielding layer is in a range of 0.5 μm to 3 μm.

In some embodiments, a material of the quantum dot functional layer includes a mixture of quantum dots and a ultraviolet (UV) curable monomer component.

In some embodiments, a mass ratio of the quantum dots to the monomer component in the mixture is in a range of 1:1 to 7:3.

The present disclosure also provides a method for fabricating a quantum dot color filter, including: forming a quantum dot functional material layer configured to emit light of a certain color under excitation of excitation light; and forming a hollowed-out portion in the quantum dot functional material layer to form the quantum dot color filter, wherein the hollowed-out portion exposes a side surface of the quantum dot functional material layer, so that the excitation light is able to arrive at the side surface.

In some embodiments, forming the quantum dot functional material layer includes: forming a light shielding layer which defines a plurality of sub-filter regions; and printing a quantum dot mixed colloid into the plurality of sub-filter regions through an ink-jet printing process to form the quantum dot functional material layer.

In some embodiments, forming the hollowed-out portion in the quantum dot functional material layer includes: pressing a template matched with the hollowed-out portion on the quantum dot functional material layer, and forming the hollowed-out portion in the quantum dot functional material layer through a nano-imprint lithography process.

In some embodiments, the quantum dot mixed colloid includes a mixture of quantum dots and a UV curable monomer component.

In some embodiments, in the quantum dot mixed colloid, a mass ratio of the quantum dots to the monomer component is in a range of 1:1 to 7:3.

The present disclosure also provides a display panel including the quantum dot color filter according to the present disclosure.

The present disclosure also provides a display device including the display panel according to the present disclosure.

DETAILED DESCRIPTION

To make the objects, technical solutions and advantages of the present disclosure more apparent, the present disclosure will be described in further detail with reference to the accompanying drawings, and it is apparent that the described embodiments are only some embodiments, not all embodiments, of the present disclosure. All other embodiments, which can be derived by a person skilled in the art from the embodiments disclosed herein without making any creative effort, shall fall within the protection scope of the present disclosure.

The shapes and sizes of the components in the drawings are not to scale, but are merely intended to facilitate an understanding of the contents of the embodiments of the present disclosure.

By taking a liquid crystal display device using a quantum dot color filter as an example, a quantum dot color filter is disposed on a liquid crystal layer, and a backlight module may emit blue light. When the blue light is incident onto the quantum dot color filter, quantum dots in the quantum dot color filter are excited by the blue light to emit light with a specific wavelength. By controlling the materials and the diameters of the quantum dots, the quantum dots can be accurately controlled to emit light with desired colors. Compared with the display panel using the conventional color filter, the display panel using the quantum dot color filter shows more vivid color, and has greatly increased brightness.

The quantum dot color filter typically includes a plurality of quantum dot layers. When the blue light is incident onto the quantum dot color filter, the contact surface of the quantum dot color filter with the blue light is only the bottom surface of the plurality of quantum dot layers. Because the contact surface of the quantum dot color filter with the blue light is small, the excitation rate of the quantum dots in the quantum dot color filter by the light is low. In general, in order to achieve a good light-emitting efficiency, thick quantum dot layers need to be fabricated, resulting in an increased thickness of the display panel.

Figure 1:
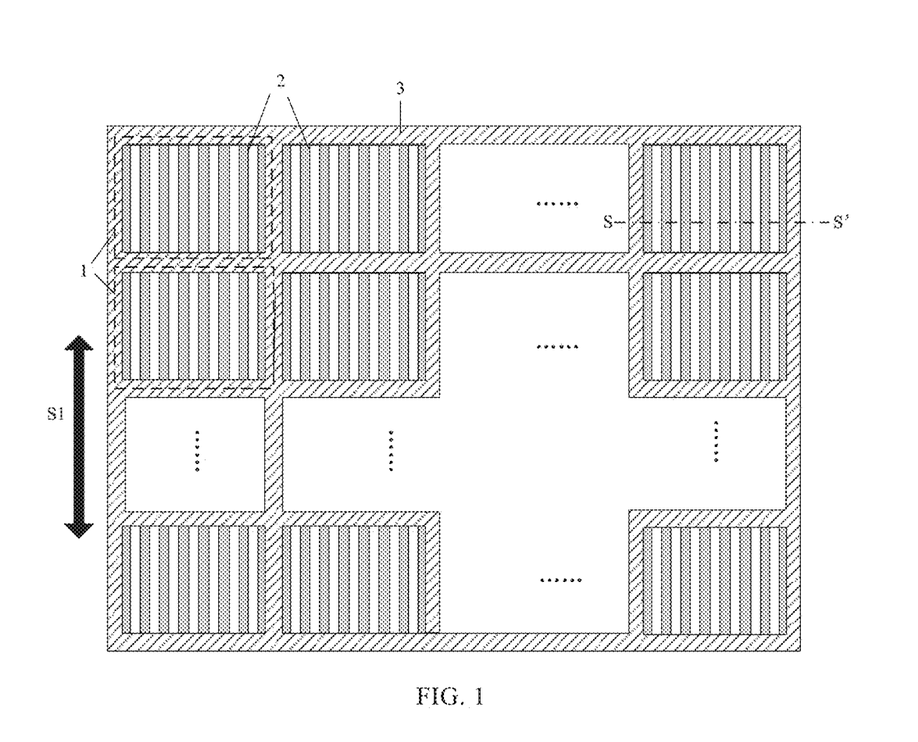
FIG. 1 is a schematic structural diagram of a quantum dot color filter according to an embodiment of the present disclosure.

As shown in FIG. 1, embodiments of the present disclosure provide a quantum dot color filter (QDCF), which may include a plurality of filter regions 1 disposed at intervals. The filter region 1 is provided therein with a quantum dot functional layer 2. The quantum dot functional layer 2 may be formed of a mixture of quantum dots and an ultraviolet (UV) curable monomer component, and thus the quantum dot functional layer 2 may emit light under excitation of excitation light. In an embodiment of the present disclosure, the quantum dot functional layer 2 has a micro pattern, which may be a hollow pattern, for example. In some embodiments, the quantum dot functional layer 2 has a hollowed-out portion exposing a side surface of the quantum dot functional layer 2, so that excitation light (e.g., blue light) can be incident onto the side surface of the quantum dot functional layer exposed by the hollowed-out portion.

In the quantum dot color filter according to the embodiments of the present disclosure, because the quantum dot functional layer 2 in the quantum dot color filter has the hollowed-out portion, when the quantum dot functional layer 2 is irradiated with blue light, the bottom surface of the quantum dot functional layer 2 can be irradiated, and the side surface of the quantum dot functional layer 2 exposed by the hollowed-out portion can also be irradiated. Therefore, compared with the quantum dot color filter of which only the bottom surface can be exposed to the blue light, the quantum dot color filter according to the embodiments of the present disclosure can increase the contact area between blue light and the quantum dot functional layer 2, and improve the excitation rate of the quantum dots by blue light, thus increasing the light-emitting efficiency of the quantum dot functional layer 2, that is, improving the light-emitting efficiency of the quantum dot color filter. If the quantum dot color filter according to the embodiments of the present disclosure is applied to a display panel, under the same brightness requirement, an amount of the quantum dots of the quantum dot color filter according to the embodiments of the present disclosure is less, and the thickness of the quantum dot functional layer is smaller, so that the power consumption of the display panel can be reduced, and the thickness of the display panel can be decreased.

In the quantum dot color filter according to the embodiment of the present disclosure, the quantum dot functional layer may be made of a mixture of quantum dots and a UV curable monomer component. The monomer component may be various types of monomer components, for example, the monomer component may be a polyhydroxy acrylate monomer. Needless to say, the monomer component may be other type of monomer component, which may be selected according to actual needs, and is not limited herein.

In the quantum dot color filter according to the embodiment of the present disclosure, the hollowed-out portion of the quantum dot functional layer may have various forms, which may be designed as needed, and are not limited herein.

Figure 2:
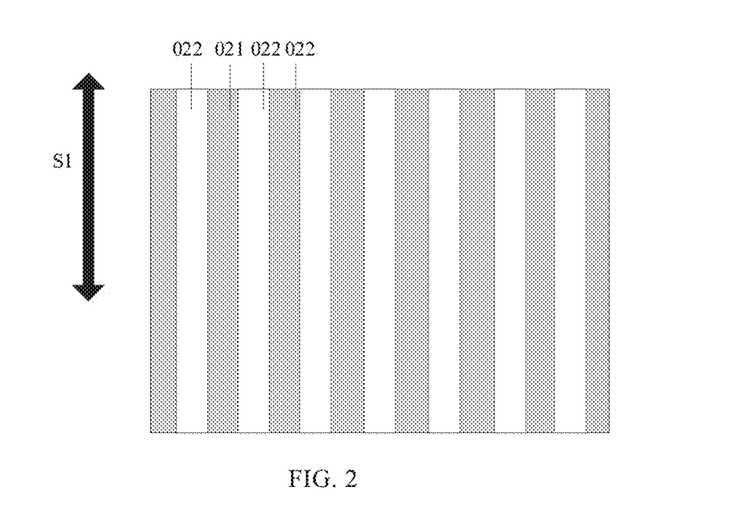
FIG. 2 is a schematic structural diagram of a single quantum dot functional layer in a quantum dot color filter according to an embodiment of the present disclosure.
Figure 3:
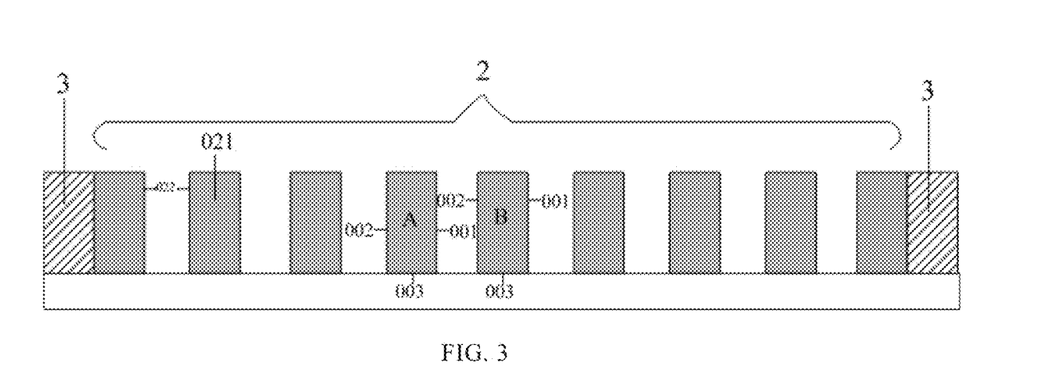
FIG. 3 is a cross-sectional view (taken along a direction S-S' in FIG. 1) of a single quantum dot functional layer in a quantum dot color filter according to an embodiment of the present disclosure.

FIG. 2 is a schematic structural diagram of a single quantum dot functional layer 2 in FIG. 1, and FIG. 3 is a cross-sectional view of the quantum dot functional layer 2 in FIG. 1, which is taken along a direction S-S'. As shown in FIG. 1, the quantum dot color filter according to the embodiment may include a plurality of filter regions 1 arranged at intervals, a quantum dot functional layer 2 is arranged in the filter region, and the quantum dot functional layer 2 has a hollowed-out portion.

Referring to FIGS. 2 and 3, the quantum dot functional layer 2 includes a plurality of strip structures 021 extending along a first direction (e.g., a column direction S1 shown in FIGS. 1 and 2), with a gap between adjacent strip structures 021, and the gap defines a hollowed-out portion 022 of the quantum dot functional layer 2. The gaps between the plurality of strip structures define a hollow pattern. Referring to FIG. 3, each of the strip structures 021 includes a first side surface 001 and a second side surface 002. By taking adjacent strip structures A and B as an example, the first side surface 001 of the strip structure A is disposed opposite to the second side surface 002 of the strip structure B, and the first side surface 001 of the strip structure A and the second side surface 002 of the strip structure B and a gap therebetween define a hollowed-out portion 022 of the quantum dot functional layer 2. When blue light is incident to the strip structures A and B, the bottom surfaces 003 of the two strip structures can be irradiated, and the first side surface 001 of the strip structure A and the second side surface 002 of the strip structure B can also be irradiated through the gap between the adjacent strip structures A and B. Similarly, when blue light is incident to the quantum dot functional layer 2 composed of a plurality of strip structures 021 spaced apart, the bottom surface of the quantum dot functional layer 2 can be irradiated, and the side surfaces of the quantum dot functional layer 2 exposed by the hollowed-out portion 022 can also be irradiated. Therefore, compared with the quantum dot color filter of which only the bottom surface can be exposed to the blue light, the quantum dot color filter according to the embodiment can increase the contact area between excitation light and the quantum dot functional layer 2, and improve the excitation rate of the quantum dots by excitation light, thus increasing the light-emitting efficiency of the quantum dot functional layer 2, that is, improving the light-emitting efficiency of the quantum dot color filter.

In the quantum dot color filter according to the embodiment, the width and number of the strip structures 021 may be set. As the width of the strip structure 021 decreases, the number of the strip structures 021 increases, the contact area between blue light and the quantum dot functional layer 2 becomes larger, the light-emitting efficiency of the quantum dot functional layer 2 becomes higher, and the requirement on the fabricating process of the quantum dot color filter becomes higher. Therefore, the width and number of the strip structures 021 may be set as needed, and are not limited herein.

In the quantum dot color filter according to the embodiment, the plurality of strip structures 021 may be uniformly distributed in the quantum dot functional layer 2, that is, the width of the gap (i.e., the hollowed-out portion 022) between every two adjacent strip structures 021 may be the same, so that the quantum dot functional layer 2 can uniformly emit light under the excitation of the excitation light.

It should be noted that the first direction may be any direction parallel to the quantum dot functional layer 2, for example, a column direction (as shown in FIG. 1 and FIG. 2), or a row direction, as long as the plurality of strip structures 021 all extend along the same direction parallel to the quantum dot functional layer 2. The first direction may be designed according to actual needs, and is not limited herein.

Figure 4:
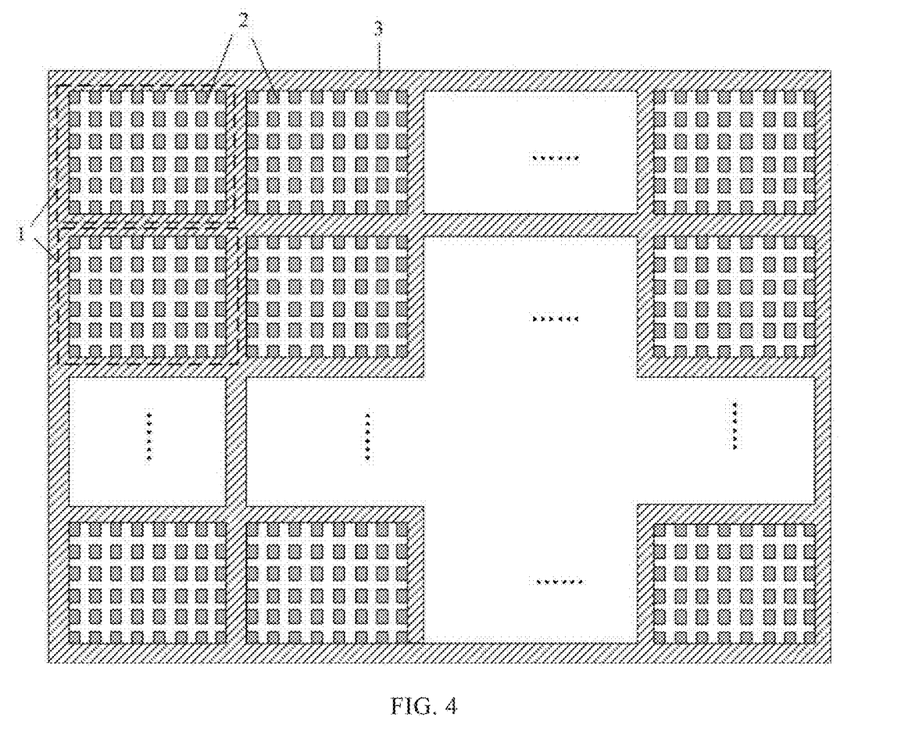
FIG. 4 is a schematic structural diagram of a quantum dot color filter according to an embodiment of the present disclosure.
Figure 5:
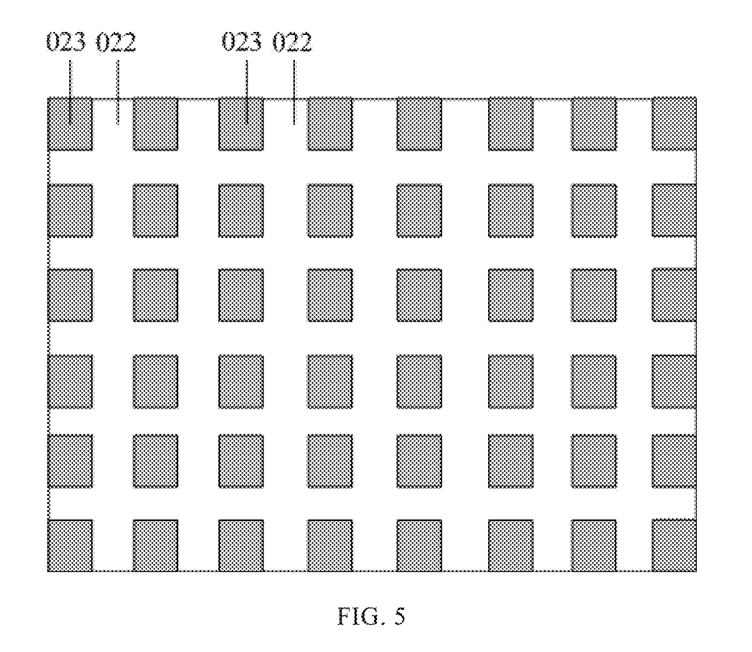
FIG. 5 is a schematic structural diagram of a single quantum dot functional layer in a quantum dot color filter according to an embodiment of the present disclosure.

FIG. 4 is a schematic structural diagram of a quantum dot color filter according to an embodiment of the present disclosure, and FIG. 5 is a schematic structural diagram of a single quantum dot functional layer 2 of the quantum dot color filter in FIG. 4. The quantum dot color filter according to the embodiment may include a plurality of filter regions 2 arranged at intervals, a quantum dot functional layer 2 is arranged in the filter region 2, and the quantum dot functional layer 2 has a hollowed-out portion.

Figure 6:
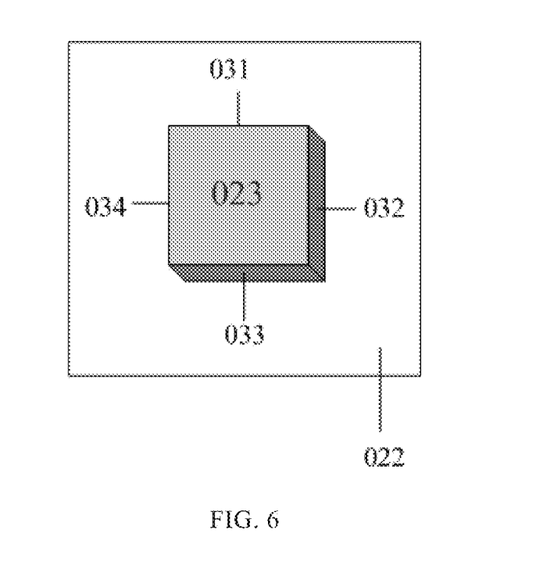
FIG. 6 is a schematic diagram of a single block structure in the quantum dot functional layer in FIG. 5.

Referring to FIG. 5, the quantum dot functional layer 2 includes a plurality of block structures 023 arranged in an array, a gap is formed between adjacent block structures 023, and the gap defines a hollowed-out portion 022 of the quantum dot functional layer 2. The gaps between the plurality of block structures 023 define a hollow pattern. FIG. 6 is a schematic diagram of a single block structure 023 in FIG. 5. As shown in FIG. 6, the block structure 023 includes four side surfaces (as shown as 031, 032, 033 and 034 in FIG. 6), a gap is present by the side of each side surface, and the opposite side surfaces of adjacent block structures 023 define a hollowed-out portion 022 of the quantum dot functional layer 2. For one block structure 023, when blue light is incident onto the block structure 023, the bottom surface of the block structure 023 can be irradiated, and four side surfaces of the block structure 023 can also be irradiated through the gaps. Similarly, when blue light is incident onto the quantum dot functional layer 2 composed of a plurality of block structures 023 spaced apart, the bottom surface of the quantum dot functional layer 2 can be irradiated, and the side surface of the quantum dot functional layer 2 exposed by the hollowed-out portion 022 can also be irradiated. Therefore, compared with the quantum dot color filter of which only the bottom surface can be exposed to the excitation light, the quantum dot color filter according to the embodiments of the present disclosure can increase the contact area between excitation light and the quantum dot functional layer 2, and improve the excitation rate of the quantum dots by excitation light, thus increasing the light-emitting efficiency of the quantum dot functional layer 2, that is, improving the light-emitting efficiency of the quantum dot color filter.

In the quantum dot color filter according to the embodiments, the block structure 023 may have various shapes, for example, the block structure 023 may be any one of a rectangular block structure, a circular block structure, and a diamond block structure. The shape of the block structure 023 may be designed according to actual needs, and is not limited herein.

In the quantum dot color filter according to the embodiment, the area of the upper surface of the block structure 023 and the number of the block structures 023 may be set. The smaller the area of the upper surface of the block structure 023 is, the larger the number of the block structures 023 is, the larger the contact area between the blue light and the quantum dot functional layer 2 is, the higher the light-emitting efficiency of the quantum dot functional layer 2 is, and the higher the requirement on the fabricating process of the quantum dot color filter is. The area of the upper surface of the block structure 023 and the number of the block structures 023 may be set as needed, and are not limited herein.

In the quantum dot color filter according to the embodiment, the plurality of block structures 023 may be uniformly distributed in the quantum dot functional layer 2, that is, the width of the gap (i.e., the hollowed-out portion) between every two adjacent block structures 023 may be the same, so that the quantum dot functional layer 2 can uniformly emit light under the excitation of the excitation light.

It should be noted that, only two implementations of the hollowed-out portion of the quantum dot functional layer 2 are described above, and in the quantum dot color filter according to the embodiments of the present disclosure, the hollow pattern of the quantum dot functional layer 2 may also have more implementations as long as the excitation light can be incident onto the side surface of the quantum dot functional layer 2 exposed by the hollowed-out portion 022. The hollowed-out portion of the quantum dot functional layer 2 may be designed as needed, and is not limited herein.

In the quantum dot color filter according to the embodiments of the present disclosure, the quantum dot color filter may include a plurality of filter regions 1 arranged at intervals, and each filter region 1 includes a plurality of sub-filter regions arranged side by side at intervals. At least part of the sub-filter regions is provided therein with a quantum dot functional layer 2. The colors of the light emitted or transmitted by adjacent sub-filter regions are different. In the sub-filter region provided with the quantum dot functional layer 2, the quantum dot functional layer 2 has a hollowed-out portion. For the sub-filter regions provided with the quantum dot functional layer 2, to make the quantum dot functional layer 2 in the sub-filter regions emit light of different colors, the wavelength of light emitted by a quantum dot in an excited state can be controlled by controlling the diameter of the quantum dot of the quantum dot functional layer 2, so that the quantum dot emits light of a desired color under the excitation of the excitation light. The wavelength of light emitted by the quantum dot in the excited state can also be controlled by choosing the alloy material of the alloy quantum dot, so that the quantum dot emits light of a desired color under the excitation of the excitation light. Needless to say, it is possible to allow each sub-filter region to emit light of a desired color in other manner, and the specific manner may be designed as needed, and is not limited herein.

It should be noted that the plurality of sub-filter regions may include sub-filter regions emitting light of a plurality of colors. For example, the sub-filter regions may include a red (R) sub-filter region, a green (G) sub-filter region, and a blue (B) sub-filter region. For another example, the sub-filter regions may include a red (R) sub-filter region, a green (G) sub-filter region, a blue (B) sub-filter region, and a white (W) sub-filter region. For another example, the sub-filter regions may include a red (R) sub-filter region, a green (G) sub-filter region, a blue (B) sub-filter region, and a yellow (Y) sub-filter region. The colors of the light emitted by the sub-filter regions may be designed as needed, and are not limited herein. The sub-filter regions including a red (R) sub-filter region, a green (G) sub-filter region, and a blue (B) sub-filter region are described below as an example. Further, the description is given by taking, as an example, the case where the hollowed-out portion of the quantum dot functional layer 2 is defined by the gaps between the plurality of strip structures.

Figure 7:
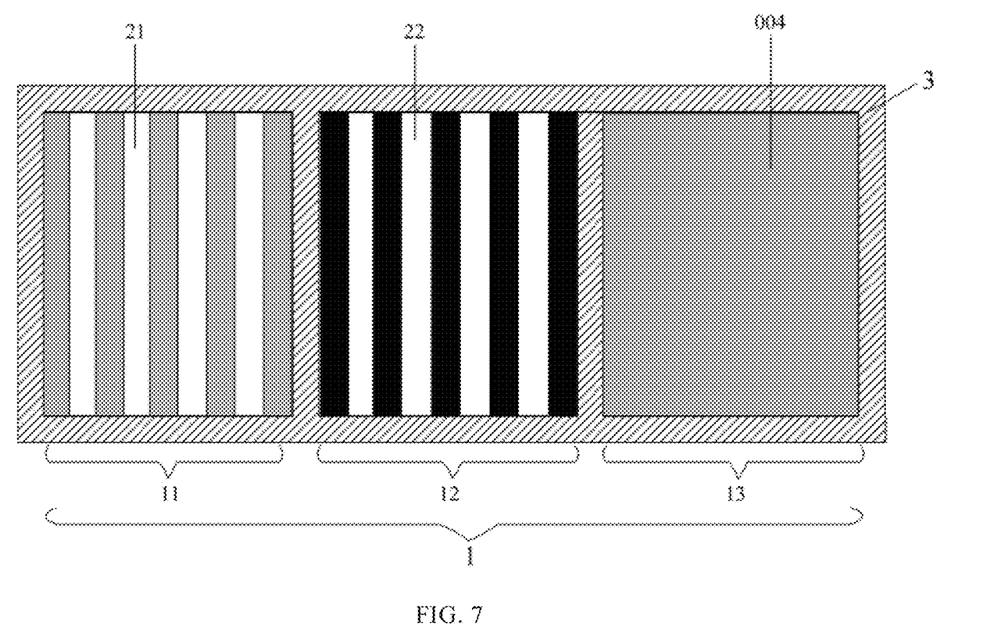
FIG. 7 is a schematic diagram of a sub-filter region of a quantum dot color filter according to an embodiment of the present disclosure.
Figure 8:
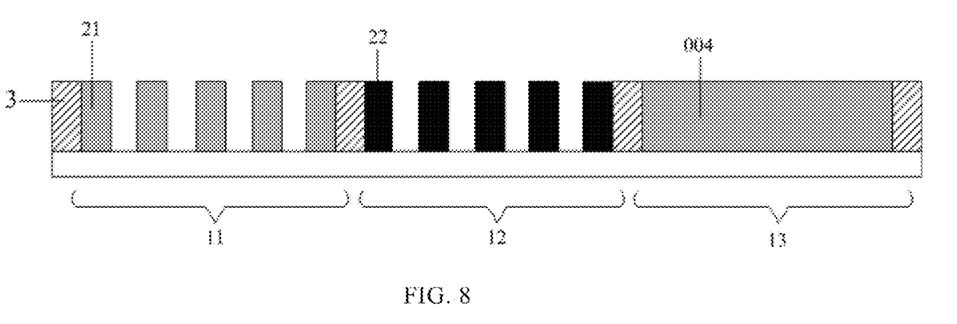
FIG. 8 is a cross-sectional view of the sub-filter region of the quantum dot color filter in FIG. 7.

FIG. 7 is a schematic diagram of a sub-filter region of a quantum dot color filter according to an embodiment of the present disclosure, and FIG. 8 is a cross-sectional view of the sub-filter region of the quantum dot color filter in FIG. 7. Referring to FIGS. 7 and 8, the sub-filter regions 1 include a red sub-filter region 11, a green sub-filter region 12, and a blue sub-filter region 13. Accordingly, the quantum dot functional layer 2 includes a red light quantum dot functional layer 21 and a green light quantum dot functional layer 22.

The red light quantum dot functional layer 21 is arranged in the red sub-filter region 11, and contains a first quantum dot material, the first quantum dot material emits red light under the excitation of blue light, and the red light quantum dot functional layer 21 has a hollowed-out portion; the green light quantum dot functional layer 22 is arranged in the green sub-filter region 12, and contains a second quantum dot material, the second quantum dot material emits green light under the excitation of blue light, and the green light quantum dot functional layer 22 has a hollowed-out portion; a transparent insulating layer 004 capable of transmitting blue light is arranged in the blue sub-filter region 13, and is made of a transparent and insulating organic material. In the quantum dot color filter according to the embodiment, if blue light is incident to the quantum dot color filter, the red light quantum dot functional layer 21 in the red sub-filter region 11 emits red light, the green light quantum dot functional layer 22 in the green sub-filter region 12 emits green light, the transparent insulating layer 004 in the blue sub-filter region 13 transmits the blue light, and the red light quantum dot functional layer 21, the green light quantum dot functional layer 22, and the transparent insulating layer 004 define a pixel unit. Moreover, blue light can arrive at the side surface of the red light quantum dot functional layer 21 exposed by the hollowed-out portion through the hollowed-out portion of the red light quantum dot functional layer 21; blue light can arrive at the side surface of the green light quantum dot functional layer 22 exposed by the hollowed-out portion through the hollowed-out portion of the green light quantum dot functional layer 22, so that the contact area between the blue light and the red light quantum dot functional layer 21 and the contact area between the blue light and the green light quantum dot functional layer 22 are increased, and the light-emitting efficiencies of the red light quantum dot functional layer 21 and the green light quantum dot functional layer 22 are increased.

Figure 9:
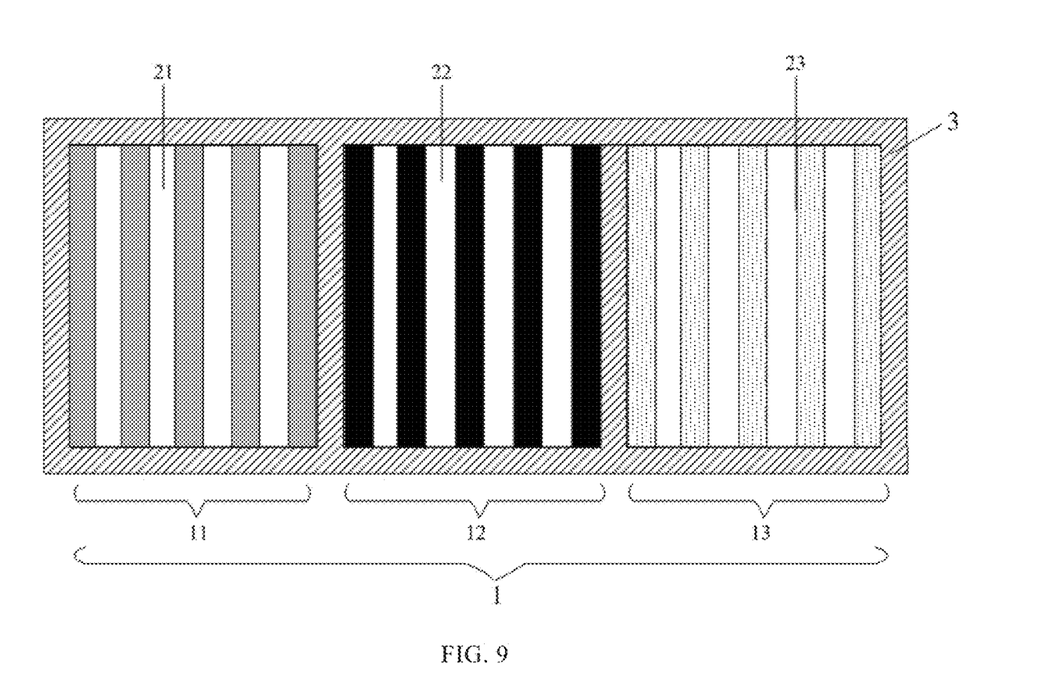
FIG. 9 is a schematic diagram of a sub-filter region of a quantum dot color filter according to an embodiment of the present disclosure.
Figure 10:
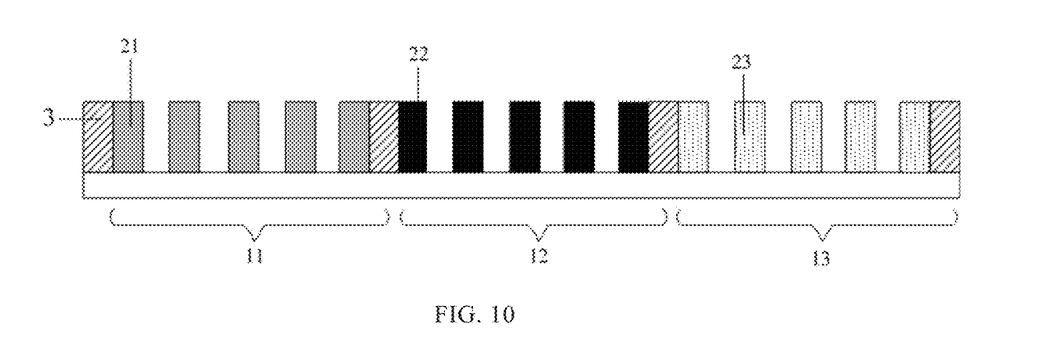
FIG. 10 is a cross-sectional view of the sub-filter region of the quantum dot color filter in FIG. 9.

FIG. 9 is a schematic diagram of a sub-filter region of a quantum dot color filter according to an embodiment of the present disclosure, and FIG. 10 is a cross-sectional view of the sub-filter region of the quantum dot color filter in FIG. 9. As shown in FIGS. 9 and 10, the plurality of sub-filter regions 1 include a red sub-filter region 11, a green sub-filter region 12, and a blue sub-filter region 13. Accordingly, the quantum dot functional layer 2 includes a red light quantum dot functional layer 21, a green light quantum dot functional layer 22, and a blue light quantum dot functional layer 23.

The red light quantum dot functional layer 21 is arranged in the red sub-filter region 11, and contains a first quantum dot material, the first quantum dot material emits red light under the excitation of blue light, and the red light quantum dot functional layer 21 has a hollowed-out portion; the green light quantum dot functional layer 22 is arranged in the green sub-filter region 12, and contains a second quantum dot material, the second quantum dot material emits green light under the excitation of blue light, and the green light quantum dot functional layer 22 has a hollowed-out portion; the blue light quantum dot functional layer 23 is arranged in the blue sub-filter region 13, and contains a third quantum dot material, the third quantum dot material emits blue light under the excitation of the blue light, and the blue light quantum dot functional layer 23 has a hollowed-out portion. In the quantum dot color filter according to the embodiment, if blue light is incident to the quantum dot color filter, the red light quantum dot functional layer 21 in the red sub-filter region 11 emits red light, the green light quantum dot functional layer 22 in the green sub-filter region 12 emits green light, the blue light quantum dot functional layer 23 in the blue sub-filter region 13 emits blue light, and the red light quantum dot functional layer 21, the green light quantum dot functional layer 22, and the blue light quantum dot functional layer 23 define a pixel unit. Moreover, the blue light can arrive at the side surface of the red light quantum dot functional layer 21 exposed by the hollowed-out portion, through the hollowed-out portion of the red light quantum dot functional layer 21; the blue light can arrive at the side surface of the green light quantum dot functional layer 22 exposed by the hollowed-out portion, through the hollowed-out portion of the green light quantum dot functional layer 22; the blue light can arrive at the side surface of the blue light quantum dot functional layer 23 exposed by the hollowed-out portion, through the hollowed-out portion of the blue light quantum dot functional layer 23, thereby increasing the contact area between the blue light and each quantum dot functional layer 2, and improving the light-emitting efficiency of each quantum dot functional layer 2.

In the quantum dot color filter according to the embodiment, a light shielding layer 3 (for example, as shown in FIG. 7 to FIG. 10), i.e., a bank structure, is disposed between adjacent sub-filter regions, and the thickness of the light shielding layer 3 is greater than or equal to the thickness of the quantum dot functional layer 2, so as to accommodate the material for forming the quantum dot functional layer 2 and prevent crosstalk of light from the sub-filter regions. In some embodiments, the thickness of the light shielding layer 3 is in the range of 0.5 μm to 3 μm.

Figure 11:
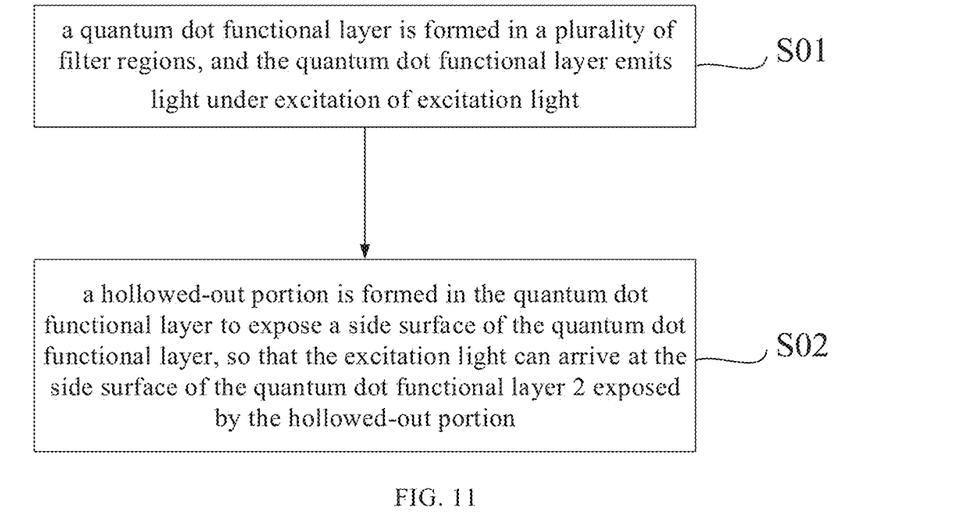
FIG. 11 is a flowchart of a method for fabricating a quantum dot color filter according to an embodiment of the present disclosure.
Figure 12:
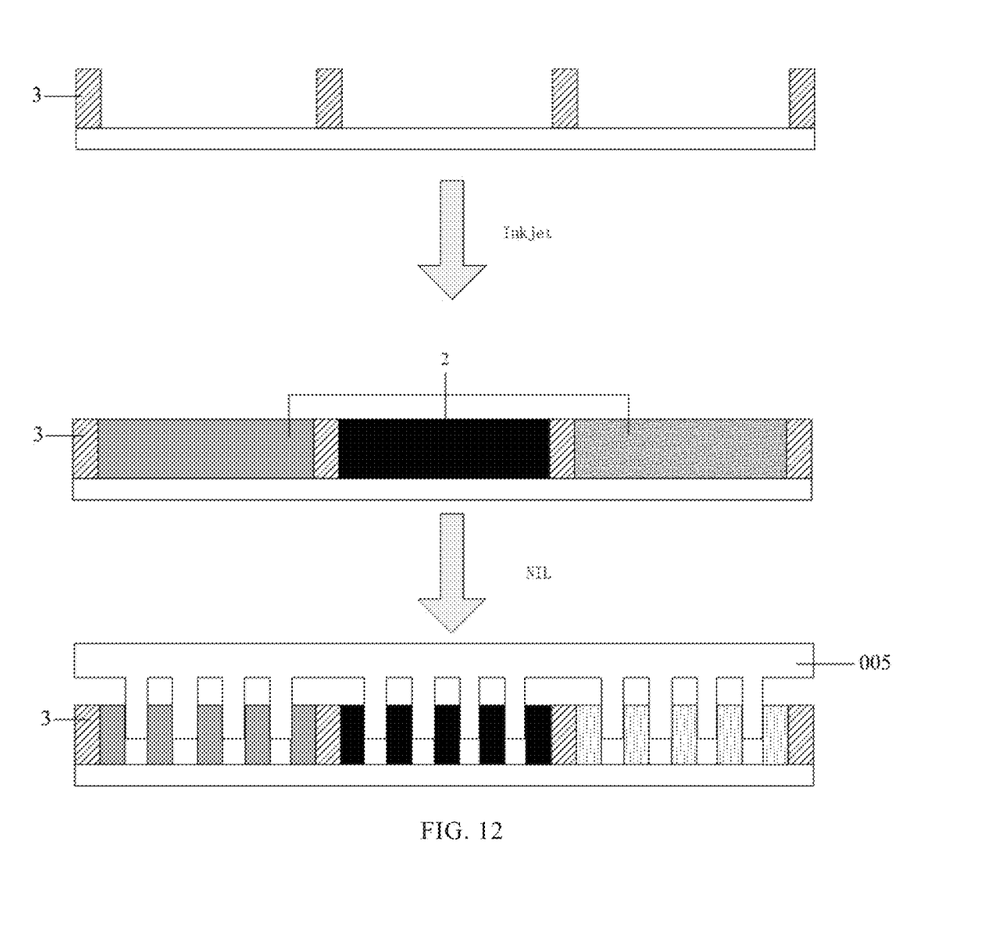
FIG. 12 is a schematic diagram illustrating a method for fabricating a quantum dot color filter according to an embodiment of the present disclosure.

Referring to FIGS. 11 and 12, an embodiment of the present disclosure provides a method for fabricating a quantum dot color filter, including steps S01 and S02.

In step S01, a quantum dot functional layer 2 is formed in a plurality of filter regions 1, and the quantum dot functional layer 2 emits light under excitation of excitation light.

In this step, firstly, a light shielding layer 3 is formed, the light shielding layer 3 defines a plurality of sub-filter regions, and the thickness of the light shielding layer 3 is larger than that of the quantum dot functional layer 2. In some embodiments, the thickness of the light shielding layer 3 is in the range of 0.5 μm to 3 μm. A quantum dot mixed colloid is printed into the plurality of sub-filter regions through an ink jet printing (Inkjet) process, and then processes such as UV curing, demoulding and the like are performed to form the quantum dot functional layer 2.

In some embodiments, the quantum dot mixed colloid includes a mixture of quantum dots and a UV curable monomer component. Resin, photoinitiator, additive, photosensitive dispersion, and the like may also be included. The material of the quantum dot mixed colloid may be designed as needed, and is not limited herein.

Furthermore, in the quantum dot mixed colloid, the mass ratio of the quantum dots to the monomer component is in the range of 1:9 to 9:1. The higher the concentration of the quantum dots, the higher the light-emitting efficiency of the quantum dot functional layer 2; the higher the concentration of the monomer component, the better the performance of the ink jet printing. In some embodiments, the mass ratio of the quantum dots to the monomer component ranges from 1:1 to 7:3. The mass ratio of the quantum dots to the monomer component may be set as needed, and is not limited herein.

At step S02, a hollowed-out portion is formed in the quantum dot functional layer 2, the hollowed-out portion exposes a side surface of the quantum dot functional layer 2, so that the excitation light can arrive at the side surface of the quantum dot functional layer 2 exposed by the hollowed-out portion.

The hollowed-out portion of the quantum dot functional layer 2 may have various forms. To form the hollowed-out portion in the quantum dot functional layer 2, a template 005 may be formed according to the hollow pattern required by the quantum dot functional layer 2, the template 005 and the quantum dot functional layer 2 are aligned, then the template 005 is pressed on the quantum dot functional layer 2, a hollowed-out pattern corresponding to the template is formed in the quantum dot functional layer 2 through a nano-imprint lithography (NIL) process, thereby finishing the formation of the hollowed-out portion in the quantum dot functional layer 2, so that when excitation light is incident to the quantum dot functional layer 2, the side surface of the quantum dot functional layer 2 exposed by the hollowed-out portion can be irradiated through the hollowed-out portion.

An embodiment of the present disclosure further provides a display panel, which includes the quantum dot color filter. The display panel may include various types of display panels, such as a liquid crystal display (LCD) panel, or an organic light-emitting diode (OLED) panel, which is not limited herein.

Figure 13:
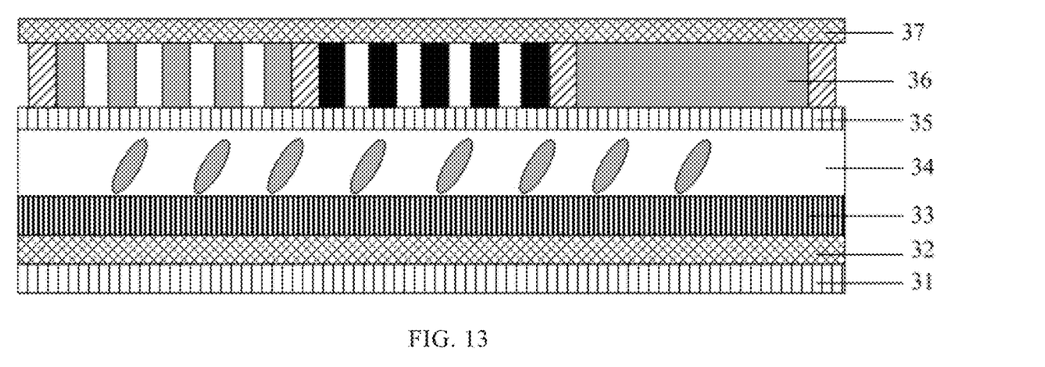
FIG. 13 is a schematic structural diagram of a display panel according to an embodiment of the present disclosure.

FIG. 13 shows an embodiment in which the quantum dot color filter according to the embodiment of the present disclosure is applied in a liquid crystal display panel. As shown in FIG. 13, the liquid crystal display panel includes a backlight module and a display panel, the backlight module emits blue light towards the quantum dot color filter, and the quantum dot functional layer 36 in the quantum dot color filter emits light under the excitation of the blue light. The display panel includes a bottom polarizer 31, a glass substrate 32, an array circuit 33, a liquid crystal (LC) layer 34, a polarizing electrode layer (WGP) 35, the quantum dot color filter 36 according to the embodiments of the present disclosure and an upper glass cover plate 37 from bottom to top in sequence. Needless to say, the structure of the liquid crystal display panel may be in other form, and may be set as needed, which is not limited herein.

Figure 14:
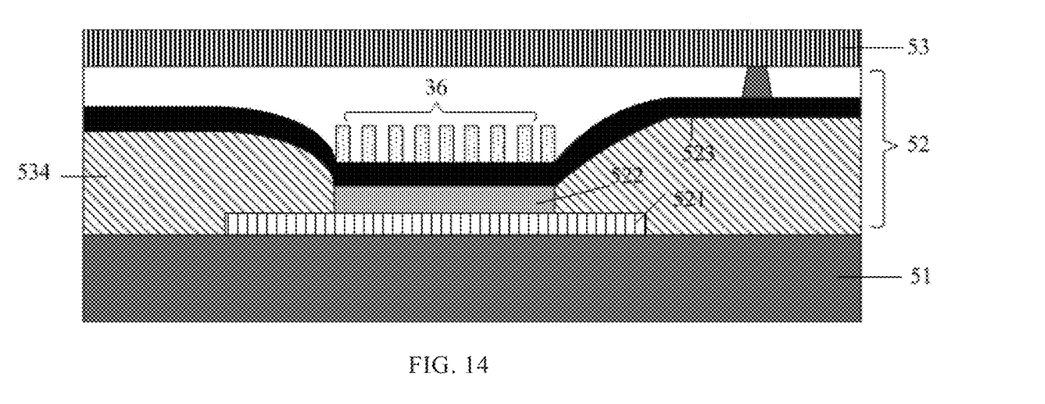
FIG. 14 is a schematic structural diagram of a display panel according to an embodiment of the present disclosure.

FIG. 14 shows an embodiment in which the quantum dot color filter according to the embodiment of the present disclosure is applied in an organic light-emitting diode panel. As shown in FIG. 14, the organic light-emitting diode panel may include an array substrate 51, a light-emitting device 52 disposed on the array substrate 51, and a touch panel 53 disposed on a side of the light-emitting device 52 away from the array substrate 51. The quantum dot color filter 36 according to the embodiments of the present disclosure is disposed in the light-emitting device 52. The light-emitting device 52 may include an anode 521 disposed on the array substrate 51, a light-emitting layer (EL) 522 disposed on a side of the anode 521 away from the array substrate 51, a cathode 523 disposed on a side of the light-emitting layer 522 away from the anode 521, and the quantum dot color filter 36 disposed on a side of the cathode 523 away from the light-emitting layer 522. The light emitted by the light-emitting layer 522 is blue light, so that the blue light emitted by the light-emitting layer 522 is incident onto the quantum dot color filter 36, and the quantum dot functional layer 2 in the quantum dot color filter 36 emits light under the excitation of the blue light. A pixel definition layer (PDL) 534 is also provided between adjacent light-emitting devices 52. Needless to say, the structure of the organic light-emitting diode panel may also be in other form, and may be designed as needed, which is not limited herein.

An embodiment of the present disclosure further provides a display device, which includes the display panel described above. The display device may be any product or component with a display function, such as a mobile phone, a tablet computer, a television, a display, a notebook computer, a digital photo frame, a navigator and the like. Other essential components of the display device as understood by those skilled in the art are not described herein, nor should they be construed as limiting the present disclosure.

In conclusion, in the quantum dot color filter according to the present disclosure, because the quantum dot functional layer 2 in the quantum dot color filter has the hollowed-out portion, when the excitation light is incident to the quantum dot functional layer 2, the bottom surface of the quantum dot functional layer 2 can be irradiated, and the side surface of the quantum dot functional layer 2 exposed by the hollowed-out portion 022 can also be irradiated through the hollowed-out portion. Therefore, compared with the quantum dot color filter of which only the bottom surface can be exposed to the blue light, the quantum dot color filter according to the embodiments of the present disclosure can increase the contact area between excitation light and the quantum dot functional layer 2, and improve the excitation rate of the quantum dots by excitation light, thus increasing the light-emitting efficiency of the quantum dot functional layer 2, that is, improving the light-emitting efficiency of the quantum dot color filter. If the quantum dot color filter according to the embodiments of the present disclosure is applied to a display panel, under the same brightness requirement, an amount of the quantum dots of the quantum dot color filter according to the embodiments of the present disclosure is less, and the thickness of the quantum dot functional layer 2 is smaller, so that the power consumption of the display panel can be reduced, and the thickness of the display panel can be decreased.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A method for fabricating a quantum dot color filter, comprising:
   forming a quantum dot functional material layer configured to emit light of a color under excitation of excitation light; and
   forming a hollowed-out portion in the quantum dot functional material layer to form the quantum dot color filter, wherein the hollowed-out portion exposes a side surface of the quantum dot functional material layer, so that the excitation light is able to arrive at the side surface,
   wherein forming the hollowed-out portion in the quantum dot functional material layer comprises:
   pressing a template matched with the hollowed-out portion on the quantum dot functional material layer, and forming the hollowed-out portion in the quantum dot functional material layer through a nano-imprint lithography process.

2. The method of claim 1, wherein forming the quantum dot functional material layer comprises:
   forming a light shielding layer which defines a plurality of sub-filter regions; and
   printing a quantum dot mixed colloid into the plurality of sub-filter regions through an ink-jet printing process to form the quantum dot functional material layer.

3. The method of claim 2, wherein the quantum dot mixed colloid comprises a mixture of quantum dots and an ultra-violet (UV) curable monomer component.

4. The method of claim 3, wherein in the quantum dot mixed colloid, a mass ratio of the quantum dots to the monomer component is in a range of 1:1 to 7:3.

* * * * *